(12) United States Patent
Lin

(10) Patent No.: US 10,992,390 B2
(45) Date of Patent: Apr. 27, 2021

(54) CIRCUIT FOR MULTIPLEXING MON PIN OF RECEIVER OPTICAL SUB-ASSEMBLY FOR OPTICAL COMMUNICATION

(71) Applicant: XIAMEN UX HIGH-SPEED IC CO., LTD., Fujian (CN)

(72) Inventor: Shaoheng Lin, Xiamen (CN)

(73) Assignee: XIAMEN UX HIGH-SPEED IC CO., LTD., Fujian (CN)

( * ) Notice: Subject to any disclaimer, the term of this patent is extended or adjusted under 35 U.S.C. 154(b) by 0 days.

(21) Appl. No.: 16/772,151

(22) PCT Filed: Feb. 27, 2018

(86) PCT No.: PCT/CN2018/077384
§ 371 (c)(1),
(2) Date: Jun. 11, 2020

(87) PCT Pub. No.: WO2019/140740
PCT Pub. Date: Jul. 25, 2019

(65) Prior Publication Data
US 2021/0075518 A1     Mar. 11, 2021

(30) Foreign Application Priority Data

Jan. 19, 2018   (CN) .......................... 201810054480.8

(51) Int. Cl.
| H04B 10/60 | (2013.01) |
| H04B 10/69 | (2013.01) |
| H04B 10/25 | (2013.01) |
| H04B 10/079 | (2013.01) |
| H03F 3/08 | (2006.01) |
| G01J 1/44 | (2006.01) |

(52) U.S. Cl.
CPC ......... H04B 10/69 (2013.01); H04B 10/0799 (2013.01); H04B 10/25 (2013.01); G01J 1/44 (2013.01); H03F 3/08 (2013.01); H04B 10/60 (2013.01); H04B 10/691 (2013.01); H04B 10/693 (2013.01)

(58) Field of Classification Search
CPC .... H04B 10/69; H04B 10/25; H04B 10/0799; H04B 10/691; H04B 10/693; H04B 10/60; G01J 1/44; H03F 3/08
USPC ........................................ 398/9–38, 202–214
See application file for complete search history.

(56) References Cited

U.S. PATENT DOCUMENTS

| 5,606,282 A * | 2/1997 | Yoshida | H03F 3/72 330/51 |
| 5,955,726 A * | 9/1999 | Takashima | G01J 1/44 250/214 C |
| 6,930,300 B1 * | 8/2005 | Douma | H04B 10/69 250/214 A |

(Continued)

*Primary Examiner* — Dibson J Sanchez
(74) *Attorney, Agent, or Firm* — Leong C. Lei

(57) ABSTRACT

Provided in the invention is a circuit for multiplexing an MON pin of a receiver optical sub-assembly for optical communication. Through a first clamping circuit, the high precision of a whole monitoring dynamic range is kept. Through a second clamping circuit, a voltage of the MON pin is clamped into an input voltage Vcont_in of the second clamping circuit, so that an external control signal Vcont_in is copied and input into the trans-impedance amplifier, and then the Vcont_in is converted into various control variables through a comparator or analog-to-digital converter.

5 Claims, 1 Drawing Sheet

(56) References Cited

U.S. PATENT DOCUMENTS

| | | | | |
|---|---|---|---|---|
| 7,676,152 | B2* | 3/2010 | Yamabana | H04B 10/07955 |
| | | | | 398/38 |
| 8,476,894 | B2* | 7/2013 | Okada | G01R 19/0092 |
| | | | | 324/96 |
| 2005/0052246 | A1* | 3/2005 | Visocchi | H03F 3/08 |
| | | | | 330/308 |
| 2005/0224697 | A1* | 10/2005 | Nishiyama | H03F 1/30 |
| | | | | 250/214 A |
| 2006/0027736 | A1* | 2/2006 | Ichino | H01L 31/02027 |
| | | | | 250/214 R |
| 2009/0202259 | A1* | 8/2009 | Tourette | G01J 1/44 |
| | | | | 398/202 |
| 2011/0139960 | A1* | 6/2011 | Christensen | G01J 1/46 |
| | | | | 250/206 |
| 2015/0295659 | A1* | 10/2015 | Nogami | H04B 10/07955 |
| | | | | 398/212 |
| 2016/0065150 | A1* | 3/2016 | Suzunaga | H03F 3/082 |
| | | | | 250/214 A |

* cited by examiner

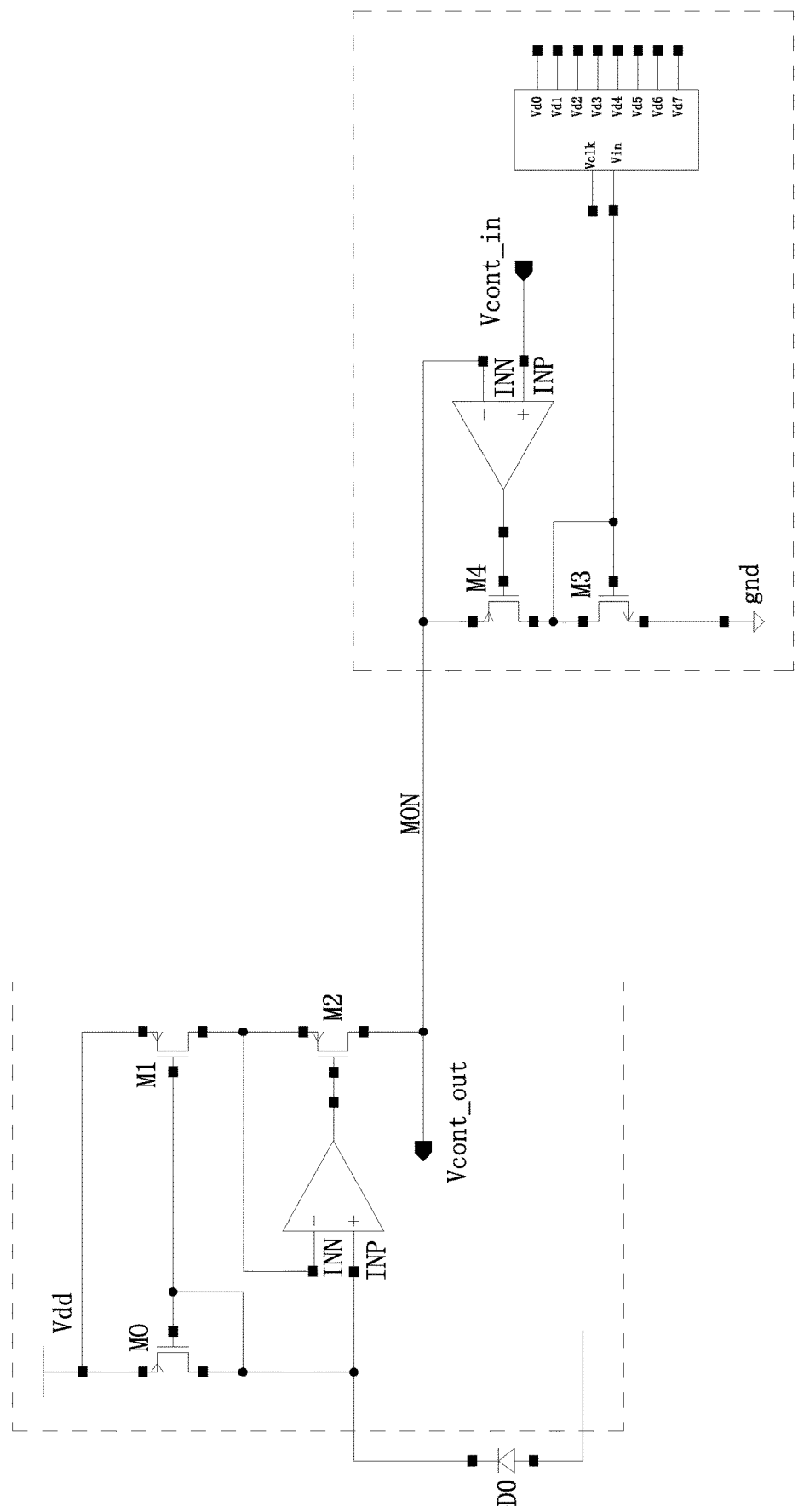

CIRCUIT FOR MULTIPLEXING MON PIN OF RECEIVER OPTICAL SUB-ASSEMBLY FOR OPTICAL COMMUNICATION

BACKGROUND OF THE INVENTION

1. Field of the Invention

The present invention relates to an optical fiber communication system, and more particularly to a trans-impedance amplifier.

2. Description of the Prior Art

A modern high-speed optical fiber communication system comprises a photoelectric conversion system therein. The photoelectric conversion system includes a photodetector PD, a trans-impedance amplifier TIA and a power amplification LA in a receiver, and a laser device LD and a laser device driver LDD in a transmitter. Because the receiver is configured to process high-frequency weak current signals, in order to minimize the interference of external parasitic parameters and external noise, the TIA and PD are usually packaged together in a receiver optical sub-assembly (ROSA).

In general, the receiver optical sub-assembly (ROSA) has 5 pins including a power source VDD, a ground GND, a high-speed data output OUTP/OUTN, and an average monitoring photocurrent output MON. The number of the pins is limited, and it is difficult to increase pins. The reason is that adding pins will increase the cost. The distribution of the pins has been used for many years, and the optical components and the optical modules have been designed to match with each other. Pin changes will cause a series of upstream and downstream support devices and equipment to be changed synchronously, which is difficult to promote. The limited pins make the functions of the TIA chip limited. Especially, it is difficult to control the working status and functions of the chip through an external control signal input, such as bandwidth/trans-impedance. This is very important for TIA products with multi-rate compatible applications, for example, a reset signal RESET, which is very useful for TIA products in burst-mode applications.

Therefore, if these 5 pins can be multiplexed, external control signals can be input into the TIA chip through these pins to control the chip, which will become very attractive.

SUMMARY OF THE INVENTION

The primary object of the present invention is to provide a circuit for multiplexing an MON pin of a receiver optical sub-assembly for optical communication, which can realize the function of inputting a control signal to a trans-impedance amplifier, without affecting the normal output monitoring current of the MON pin.

In order to achieve the above object, the present invention provides a circuit for multiplexing an MON pin of a receiver optical sub-assembly for optical communication, comprising a receiver optical sub-assembly, a monitoring current receiving component and a control signal input component located outside the receiver optical sub-assembly;

the receiver optical sub-assembly including a trans-impedance amplifier, a photodiode D0, a first clamping circuit, and a current mirror;

two output terminals of the current mirror being respectively connected to the first clamping circuit so that potentials of the two output terminals of the current mirror are equal; a monitoring current output from the current mirror flowing from a MON pin to the monitoring current receiving component, and being converted into a voltage signal by the monitoring current receiving component and then input into a first analog-to-digital converter to be converted into a digital signal, thereby realizing a current monitoring function; the control signal input component comprising a second clamping circuit, an output terminal of the second clamping circuit being connected to the MON pin, a voltage Vcont_out of the MON pin being clamped into an input voltage Vcont_in of the second clamping circuit; a voltage comparator or analog-to-digital converter in the receiver optical sub-assembly converting the input voltage Vcont_in into various control variables, thereby controlling the trans-impedance amplifier in the receiver optical sub-assembly;

the input voltage Vcont_in of the second clamping circuit being able to satisfy the first clamping circuit and the second clamping circuit to work normally.

In a preferable embodiment, the current mirror includes PMOS transistors M0 and M1; wherein gates of the PMOS transistors M0 and M1 are connected to each other, sources of the PMOS transistors M0 and M1 are connected to each other, the source of the PMOS transistor M0 is connected to a power source voltage Vdd, and a drain of the PMOS transistor M0 is connected to the gate of the PMOS transistor M0.

In a preferable embodiment, the first clamping circuit includes a first error amplifier and a PMOS transistor M2; wherein the drains of the PMOS transistors M0 and M1 are connected to positive and negative input terminals of the first error amplifier respectively, wherein the positive input terminal of the first error amplifier is further connected to a cathode of the photodiode D0; an output terminal of the first error amplifier is connected to a gate of the PMOS transistor M2; a source of the PMOS transistor M2 is connected to the drain of the PMOS transistor M1, and a drain of the PMOS transistor M2 is connected to the MON pin.

In a preferable embodiment, the second clamping circuit includes a second error amplifier and a PMOS transistor M4; wherein a negative input terminal of the second error amplifier is connected to the MON pin, a positive input terminal of the second error amplifier is connected to the input voltage Vcont_in, an output terminal of the second error amplifier is connected to a gate of the PMOS transistor M4; and a source of the PMOS transistor M4 is connected to the MON pin.

In a preferable embodiment, the monitoring current receiving component is an NMOS transistor M3, a drain of the NMOS transistor M3 is connected to a drain of the PMOS transistor M4, a source of the NMOS transistor M3 is grounded, a gate of the NMOS transistor M3 is connected to the drain of the NMOS transistor M3; the gate of the NMOS transistor M3 is further connected to the first analog-to-digital converter.

Compared with the prior art, the technical solution of the present invention has the following beneficial effects:

The present invention provides a circuit for multiplexing an MON pin of a receiver optical sub-assembly for optical communication. The potentials of the drains of the PMOS transistors M0 and M1 in the current mirror are kept equal through the first clamping circuit, thereby keeping the high precision of a whole monitoring dynamic range. After flowing out through the MON pin, the monitoring current flows into the NMOS transistor M3 and is converted into a gate voltage of the NMOS transistor M3, and the gate voltage is input into the first analog-to-digital converter and then is converted into digital quantity, thereby realizing a current monitoring function.

The present invention provides a circuit for multiplexing an MON pin of a receiver optical sub-assembly for optical communication. Through the second clamping circuit, the voltage of the MON pin is clamped into the input voltage Vcont_in of the second clamping circuit, so the voltage Vcont_out of the MON pin is read in the trans-impedance amplifier, that is, an input control voltage. In this mode, an external control signal Vcont_in is copied and input into the trans-impedance amplifier, and then the Vcont_in is converted into various control variables through a comparator or analog-to-digital converter. Thus, multiplexing of the MON pin is achieved.

The present invention provides a circuit for multiplexing an MON pin of a receiver optical sub-assembly for optical communication. In the whole monitoring dynamic range and in the input control voltage range, it only needs to satisfy the two clamping circuits to work normally, that is, the drain voltages of the current mirror can be almost equal, and Vcont_in and Vcont_out can be almost equal, so that the monitoring function and input control signal function work normally at the same time. Therefore, as long as Vcont_in can make the PMOS transistors M2 and M4 work in a saturated state, Vcont_in can be changed within a certain range. Within this range, different Vcont_in can be converted into different control variables for the trans-impedance amplifier to perform different controls.

The present invention provides a circuit for multiplexing an MON pin of a receiver optical sub-assembly for optical communication. Since the input terminals of the two error amplifiers are both high-impedance inputs, the mirror current is not shunted, and the mirror current output from the PMOS transistor M1 is all output into the NMOS transistor M3, so the current monitoring function can be normally implemented.

BRIEF DESCRIPTION OF THE DRAWINGS

FIG. 1 is a circuit diagram of a preferred embodiment of the present invention.

DETAILED DESCRIPTION OF THE PREFERRED EMBODIMENTS

Embodiments of the present invention will now be described, by way of example only, with reference to the accompanying drawings.

Referring to FIG. 1, a circuit for multiplexing an MON pin of a receiver optical sub-assembly for optical communication comprises the receiver optical sub-assembly, a monitoring current receiving component and a control signal input component located outside the receiver optical sub-assembly.

The receiver optical sub-assembly includes a trans-impedance amplifier, a photodiode D0, a first clamping circuit, and a current mirror.

The current mirror includes PMOS transistors M0 and M1. Wherein, gates of the PMOS transistors M0 and M1 are connected to each other. Sources of the PMOS transistors M0 and M1 are also connected to each other. The source of the PMOS transistor M0 is connected to a power source voltage Vdd. A drain of the PMOS transistor M0 is connected to the gate of the PMOS transistor M0.

The first clamping circuit includes a first error amplifier and a PMOS transistor M2. Wherein, the drains of the PMOS transistors M0 and M1 are connected to positive and negative input terminals of the first error amplifier, respectively. The positive input terminal of the first error amplifier is further connected to a cathode of the photodiode D0. An output terminal of the first error amplifier is connected to a gate of the PMOS transistor M2. A source of the PMOS transistor M2 is connected to the drain of the PMOS transistor M1. A drain of the PMOS transistor M2 is connected to the MON pin.

The control signal input component includes a second clamping circuit. The second clamping circuit includes a second error amplifier and a PMOS transistor M4. A negative input terminal of the second error amplifier is connected to the MON pin. A positive input terminal of the second error amplifier is connected to an input voltage Vcont_in. An output terminal of the second error amplifier is connected to a gate of the PMOS transistor M4. A source of the PMOS transistor M4 is connected to the MON pin.

The monitoring current receiving component is an NMOS transistor M3. A drain of the NMOS transistor M3 is connected to a drain of the PMOS transistor M4. A source of the NMOS transistor M3 is grounded. A gate of the NMOS transistor M3 is connected to the drain of the NMOS transistor M3. The gate of the NMOS transistor M3 is further connected to a first analog-to-digital converter.

Therefore, in the above circuit, two output terminals of the current mirror are respectively connected to the first clamping circuit, so that potentials of the two output terminals of the current mirror are equal. A monitoring current output from the current mirror flows from the MON pin to the monitoring current receiving component, and is converted into a voltage signal by the monitoring current receiving component and then input into the first analog-to-digital converter to be converted into a digital signal, thereby realizing a current monitoring function.

An output terminal of the second clamping circuit is connected to the MON pin, and a voltage Vcont_out of the MON pin is clamped into an input voltage Vcont_in of the second clamping circuit. A second analog-to-digital converter in the receiver optical sub-assembly converts the input voltage Vcont_in into various control variables, thereby controlling the trans-impedance amplifier in the receiver optical sub-assembly.

In the circuit for multiplexing the MON pin of the receiver optical sub-assembly for optical communication, the potentials of the drains of the PMOS transistors M0 and M1 in the current mirror are kept equal through the first clamping circuit, thereby keeping the high precision of a whole monitoring dynamic range. After flowing out through the MON pin, the monitoring current flows into the NMOS transistor M3 and is converted into a gate voltage of the NMOS transistor M3, and the gate voltage is input into the first analog-to-digital converter and then is converted into digital quantity, thereby realizing a current monitoring function.

Through the second clamping circuit, the voltage of the MON pin is clamped into the input voltage Vcont_in of the second clamping circuit, so the voltage Vcont_out of the MON pin is read in the trans-impedance amplifier, that is, an input control voltage. In this mode, an external control signal Vcont_in is copied and input into the trans-impedance amplifier, and then the Vcont_in is converted into various control variables through a comparator or analog-to-digital converter. Thus, multiplexing of the MON pin is achieved.

Specifically, in the whole monitoring dynamic range and in the input control voltage range, it only needs to satisfy the two clamping circuits to work normally, that is, the voltages of the drains of the current mirror can be almost equal, and Vcont_in and Vcont_out can be almost equal, so that the monitoring function and input control signal function work normally at the same time. Therefore, as long as Vcont_in can make the PMOS transistors M2 and M4 work in a saturated state, Vcont_in can be changed within a certain range. Within this range, different Vcont_in can be converted into different control variables for the trans-impedance amplifier to perform different controls.

Moreover, since the input terminals of the two error amplifiers are both high-impedance inputs, the mirror current is not shunted, and the mirror current output from the PMOS transistor M1 is all output into the NMOS transistor M3, so the current monitoring function can be normally implemented.

Although particular embodiments of the present invention have been described in detail for purposes of illustration, various modifications and enhancements may be made without departing from the spirit and scope of the present invention. Accordingly, the present invention is not to be limited except as by the appended claims

What is claimed is:

1. A circuit for multiplexing an MON pin of a receiver optical sub-assembly for optical communication, comprising a receiver optical sub-assembly, a monitoring current receiving component and a control signal input component located outside the receiver optical sub-assembly;

the receiver optical sub-assembly including a trans-impedance amplifier, a photodiode (D0), a first clamping circuit, and a current mirror;

two output terminals of the current mirror being respectively connected to the first clamping circuit so that potentials of the two output terminals of the current mirror are equal; a monitoring current output from the current mirror flowing from a MON pin to the monitoring current receiving component, and being converted into a voltage signal by the monitoring current receiving component and then input into a first analog-to-digital converter to be converted into a digital signal, thereby realizing a current monitoring function;

the control signal input component comprising a second clamping circuit, an output terminal of the second clamping circuit being connected to the MON pin, a voltage Vcont_out of the MON pin being clamped into an input voltage Vcont_in of the second clamping circuit; a voltage comparator or analog-to-digital converter in the receiver optical sub-assembly converting the input voltage Vcont_in into various control variables, thereby controlling the trans-impedance amplifier in the receiver optical sub-assembly;

the input voltage Vcont_in of the second clamping circuit being able to satisfy the first clamping circuit and the second clamping circuit to work normally.

2. The circuit as claimed in claim 1, wherein the current mirror includes PMOS transistors (M0) and (M1); wherein gates of the PMOS transistors (M0) and (M1) are connected to each other, sources of the PMOS transistors (M0) and (M1) are connected to each other, the source of the PMOS transistor (M0) is connected to a power source voltage Vdd, and a drain of the PMOS transistor (M0) is connected to the gate of the PMOS transistor (M0).

3. The circuit as claimed in claim 2, wherein the first clamping circuit includes a first error amplifier and a PMOS transistor (M2); wherein drains of the PMOS transistors (M0) and (M1) are connected to positive and negative input terminals of the first error amplifier respectively, wherein the positive input terminal of the first error amplifier is further connected to a cathode of the photodiode (D0); an output terminal of the first error amplifier is connected to a gate of the PMOS transistor (M2); a source of the PMOS transistor (M2) is connected to the drain of the PMOS transistor (M1), and a drain of the PMOS transistor (M2) is connected to the MON pin.

4. The circuit as claimed in claim 3, wherein the second clamping circuit includes a second error amplifier and a PMOS transistor (M4); wherein a negative input terminal of the second error amplifier is connected to the MON pin, a positive input terminal of the second error amplifier is connected to the input voltage Vcont_in, an output terminal of the second error amplifier is connected to a gate of the PMOS transistor (M4); and a source of the PMOS transistor (M4) is connected to the MON pin.

5. The circuit as claimed in claim 3, wherein the monitoring current receiving component is an NMOS transistor (M3), a drain of the NMOS transistor (M3) is connected to a drain of the PMOS transistor (M4), a source of the NMOS transistor (M3) is grounded, a gate of the NMOS transistor (M3) is connected to the drain of the NMOS transistor (M3); the gate of the NMOS transistor (M3) is further connected to the first analog-to-digital converter.

* * * * *